(12) United States Patent
Halling

(10) Patent No.: US 7,692,164 B2
(45) Date of Patent: Apr. 6, 2010

(54) DOSE UNIFORMITY CORRECTION TECHNIQUE

(75) Inventor: Alfred M. Halling, Wenham, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 358 days.

(21) Appl. No.: 11/739,314

(22) Filed: Apr. 24, 2007

(65) Prior Publication Data

US 2008/0067438 A1   Mar. 20, 2008

(51) Int. Cl.
*H01J 37/317*   (2006.01)
*H01J 37/20*   (2006.01)

(52) U.S. Cl. .............................. 250/492.21; 250/442.11

(58) Field of Classification Search ............ 250/492.21, 250/442.11
See application file for complete search history.

(56) References Cited

U.S. PATENT DOCUMENTS

| | | | |
|---|---|---|---|
| 4,593,200 A | 6/1986 | McGuire, III | |
| 4,736,107 A | 4/1988 | Myron | |
| 4,980,562 A | 12/1990 | Berrian et al. | |
| 5,160,846 A | 11/1992 | Ray | |
| 5,177,366 A | 1/1993 | King et al. | |
| 5,293,216 A | 3/1994 | Moslehi | |
| 5,311,028 A | 5/1994 | Glavish | |
| 5,393,984 A | 2/1995 | Glavish | |
| 5,432,352 A | 7/1995 | van Bavel | |
| 5,481,116 A | 1/1996 | Glavish et al. | |
| 5,483,077 A | 1/1996 | Glavish | |
| 5,719,495 A | 2/1998 | Moslehi | |
| 6,414,329 B1 | 7/2002 | Benveniste et al. | |
| 6,429,442 B1 | 8/2002 | Tomita et al. | |
| 6,521,895 B1 | 2/2003 | Walther et al. | |
| 6,534,775 B1 | 3/2003 | Harrington et al. | |
| 6,777,696 B1 | 8/2004 | Rathmell et al. | |
| 6,881,966 B2 | 4/2005 | Benveniste et al. | |
| 6,908,836 B2 | 6/2005 | Murrell et al. | |
| 6,992,310 B1 * | 1/2006 | Ferrara et al. | 250/492.21 |
| 7,119,343 B2 * | 10/2006 | Asdigha et al. | 250/442.11 |
| 2003/0197133 A1 | 10/2003 | Turner et al. | |
| 2003/0224541 A1 | 12/2003 | Huang et al. | |
| 2004/0126946 A1 | 7/2004 | Kim et al. | |
| 2005/0232749 A1 * | 10/2005 | Vanderpot et al. | 414/805 |
| 2005/0280082 A1 | 12/2005 | Li et al. | |
| 2006/0113495 A1 | 6/2006 | Chen et al. | |

FOREIGN PATENT DOCUMENTS

| | | |
|---|---|---|
| EP | 0 986 091 A | 3/2000 |
| JP | 11 007915 A | 1/1999 |
| WO | WO 91/04569 A | 4/1991 |

OTHER PUBLICATIONS

PCT International Search Report for PCT/US07/009257 mailed Sep. 18, 2007, pp. 1-4.

* cited by examiner

*Primary Examiner*—Nikita Wells
*Assistant Examiner*—Johnnie L Smith
(74) *Attorney, Agent, or Firm*—Eschweiler & Associates, LLC

(57) ABSTRACT

Non uniform ion implantations in a pendulum type of ion implantation are mitigated by adjusting movement of a wafer according to a corresponding non uniform function. More particularly, a non uniform ion implantation function is obtained by measuring and/or modeling ion implantations. Then, movement of a wafer along a second non arcuate scan path is adjusted according to the non uniform ion implantation function to facilitate uniform ion implantations.

17 Claims, 11 Drawing Sheets

DOSE UNIFORMITY CORRECTION TECHNIQUE

FIELD OF THE INVENTION

The present invention relates generally to ion implantation systems, and more particularly to mitigating non-uniform ion implantations in a target workpiece.

BACKGROUND OF THE INVENTION

Ion implantation systems are mechanisms utilized to dope semiconductor substrates with dopants or impurities in integrated circuit manufacturing. In such systems, a dopant material is ionized and an ion beam is generated there-from. The beam is directed at the surface of a semiconductor wafer or workpiece in order to implant the wafer with one or more dopant elements. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for directing and/or filtering (e.g., mass resolving) the ions within the beam using magnetic fields, and a target chamber containing one or more semiconductor wafers or workpieces to be implanted by the ion beam.

Ion implanters are advantageous because they allow for precision with regard to both quantity and placement of dopants within the silicon. In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree to which ions are implanted or the depth of the implanted ions.

One commercially available ion implantation system uses an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically circular wafers. The energy of the ion beam is sufficient to cause ions that strike the wafers to penetrate those wafers in the implantation chamber. Such selective implantation thus allows an integrated circuit to be fabricated.

It can be appreciated that given the continuing trend in the electronics industry to scale down electronic devices to produce smaller, yet more powerful devices (e.g., cell phones, digital cameras, etc.) that can perform a greater number of increasingly complex functions with less power, that semiconductors and integrated circuits (e.g., transistors, etc.) utilized in these devices are continually reduced in size. The ability to "pack" more of these devices onto a single semiconductor substrate, or portion thereof (known as a die) also improves fabrication efficiency and yield. To increase packing densities, features formed in and on a wafer as part of the semiconductor fabrication process may be reduced in size. It can be appreciated that the accuracy with which dopants can be added to select locations of semiconductor substrates plays a critical role in successfully increasing packing densities. For example, there may be smaller margins for error with regard to implanting dopant ions within select locations of the semiconductor substrate given the reduced feature sizes. Accordingly, mechanisms and techniques that facilitate more accurate and uniform ion implantations are desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

Non uniform ion implantations in a pendulum type of ion implantation are mitigated by adjusting movement of a wafer according to a corresponding non uniform function. More particularly, a non uniform ion implantation function is obtained by measuring and/or modeling ion implantations. Then, movement of a wafer along a second non arcuate scan path is adjusted according to the non uniform ion implantation function to facilitate uniform ion implantations.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 4 is a perspective view of an example of a portion of a lattice structure, such as that depicted in FIG. 1, wherein a mechanical surface of the structure is not substantially co-planar there-with.

DETAILED DESCRIPTION OF THE INVENTION

Figure 1:
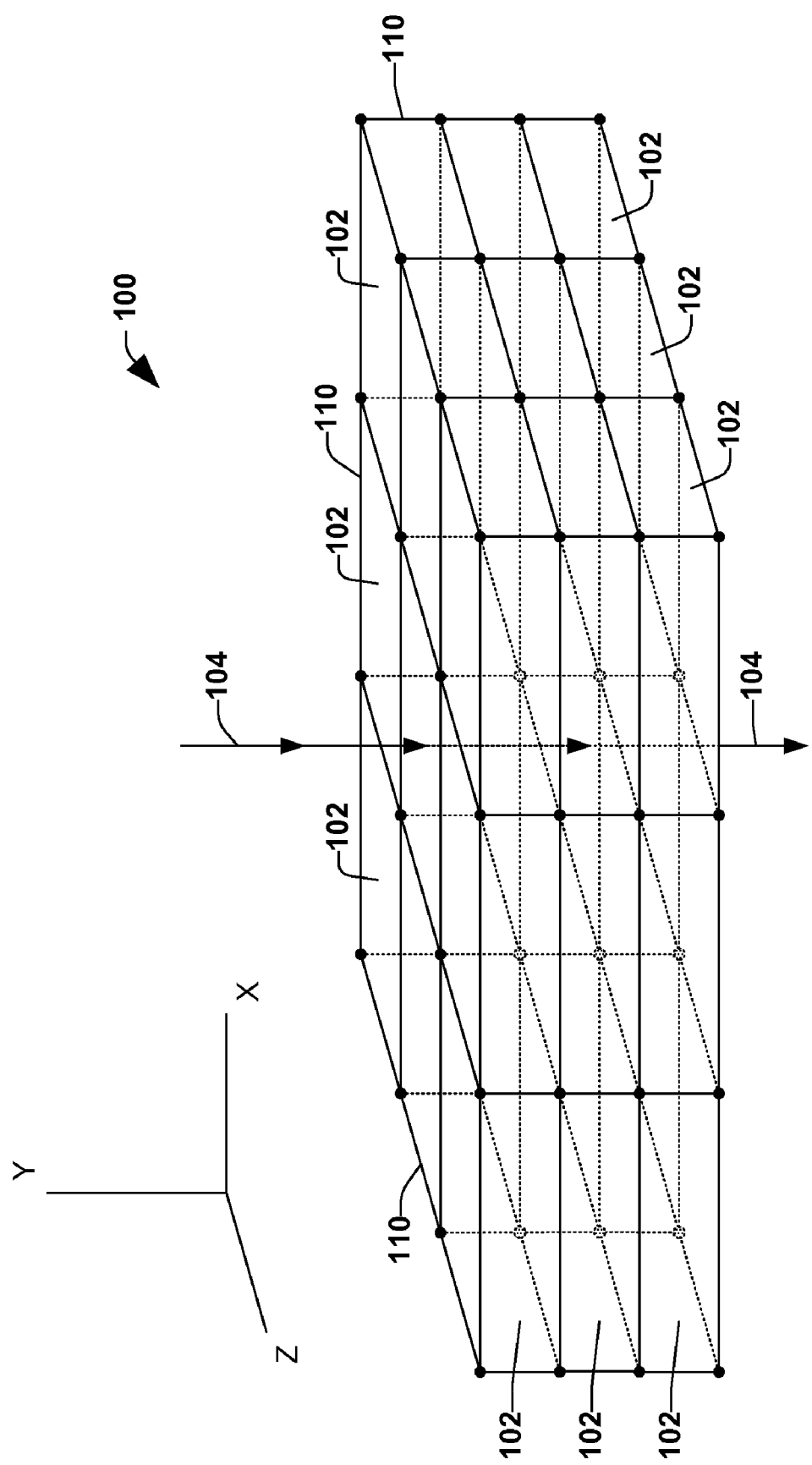
FIG. 1 is a perspective view of an example of a portion of a lattice structure wherein an ion beam is directed at the lattice structure substantially parallel to planes of the lattice structure.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

As alluded to above, in semiconductor fabrication processing, semiconductor wafers or workpieces are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

The base layers or substrate are generally composed of silicon in a crystalline form. Materials are said to have a crystalline structure when their atoms are arranged in three dimensions in a regular manner, known as a crystalline lattice. By way of example, FIG. 1 illustrates a portion of a generic lattice structure 100 having a generally cubic configuration. In particular, in the example illustrated, the lattice structure 100 has twenty-seven (e.g., three by three by three) cells 102 that are generally cubical in shape. The lattice structure of the crystal exists within planes 110, and these planes 110 are substantially perpendicular to one another in the illustrated example (e.g., in the x, y, and z directions). It is to be appreciated, however, that lattice structures can come in any of a variety of different configurations and have any number of cells having any number of a variety of different shapes, such as diamond, pyramidal, hexagonal, etc.

The silicon base layers utilized in semiconductor fabrication are also referred to as wafers or substrates, at least in part, because they are cut from bulk silicon. In particular, very specific types of single crystals of silicon, known as boules, are grown into long lengths and thin slices (e.g., wafers) are cut there-from. Such wafers are generally designated with Miller Index data, such as (100) which is indicative of the relative orientation of the lattice structure to the cut surface of the wafer. The crystalline structure of the wafers is advantageous in electronic devices because it facilitates control of the electrical properties of the device and exhibits uniform electrical performance throughout the entire material. Additionally, because impurities that degrade device performance tend to collect around irregularities in the atomic structure of a material, the regularity of the crystalline structure provides for more predictable device performance and yield.

It can be appreciated that an important parameter of a semiconductor doping process is the angle of incidence between an ion beam and the internal lattice structure of the semiconductor material. The angle of incidence is important because it plays a role in a phenomenon known as channeling, among other things. In particular, as illustrated in FIG. 1, if the direction of the beam of dopant ions 104 is substantially parallel to (vertical) planes 110 of the lattice structure, the beam may pass there-through with less energy loss per unit length, because ions moving in the space between the planes have fewer collisions with crystal atoms. As such, the ions may be implanted deeply within the substrate.

Figure 2:
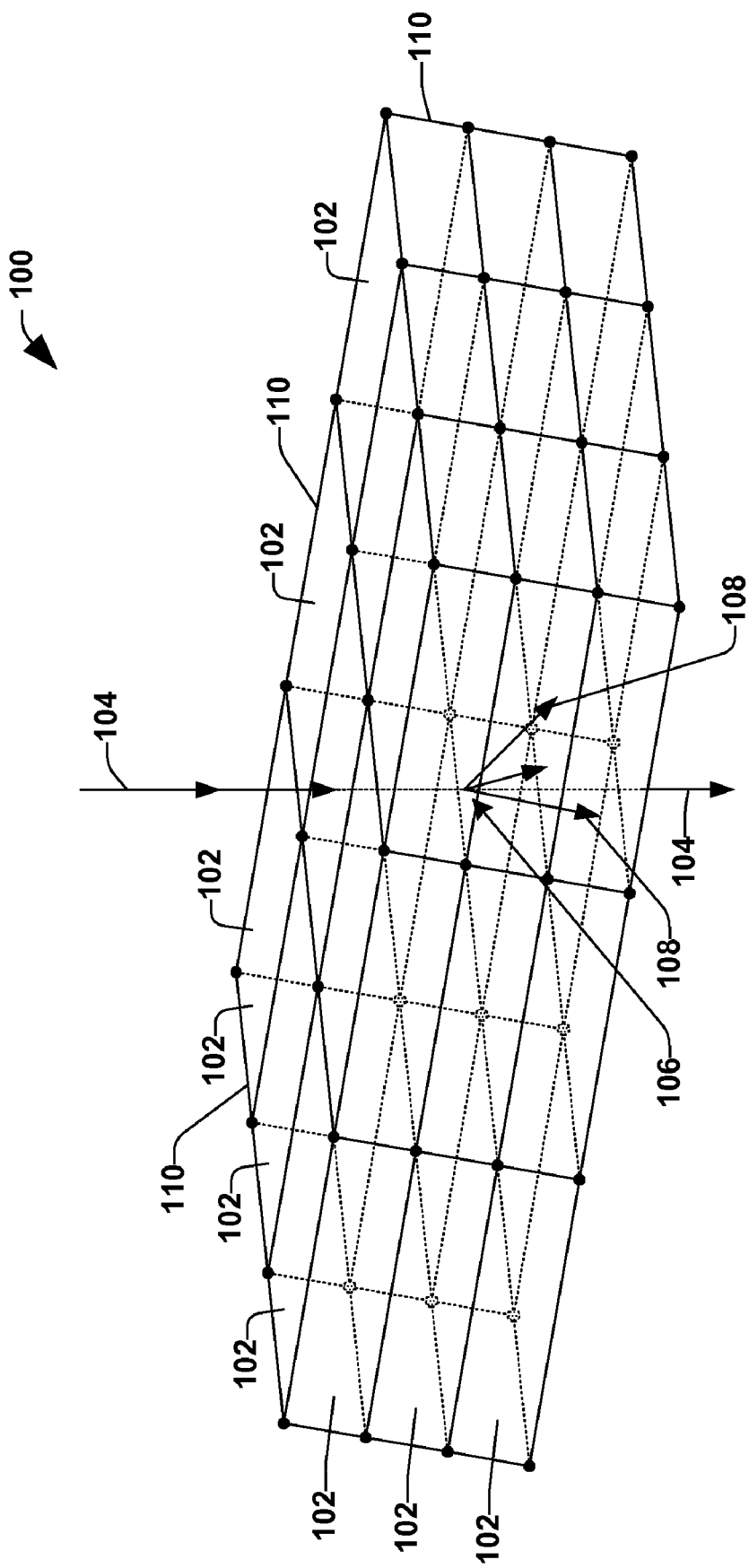
FIG. 2 is a perspective view of an example of a portion of a lattice structure, such as that depicted in FIG. 1, wherein an ion beam is directed at the lattice structure not substantially parallel to planes of the lattice structure.

In contrast to FIG. 1, the direction of the beam 104 in FIG. 2 is not substantially parallel to (vertical) planes 110 of the lattice structure 100. As such, some of the ions within the ion beam 104 will likely impact portions 106 of the lattice structure and alter (e.g., damage) the lattice structure. In so doing, the ions will likely lose energy and slow down and/or be scattered from their original trajectory as indicated by arrows 108, thereby coming to rest in shallower portions of the workpiece. Accordingly, it may be desirable to direct the ion beam at a particular orientation relative to the lattice structure to achieve a desired level of channeling and/or localization of doping, for example. It can be appreciated that it would also be desirable to maintain this relative orientation between the beam and the crystalline lattice structure while the relative orientation between the beam and the wafer is varied during the implantation process.

In addition to the orientation between the beam and the lattice structure of the wafer, it can be appreciated that the orientation of the beam relative to the mechanical surface of the wafer is also important to control shadowing, among other things, for example, where shadowing refers to situations where certain portions of the wafer may receive little to no dopant because the beam is blocked by one or more adjacent features on the wafer. Shadowing generally results from the continuing trend in the electronics industry to scale down features to produce smaller, more powerful devices (e.g., cell phones, digital cameras, etc.) that can perform a greater number of increasingly complex functions with less power.

Scaling generally requires that features formed in and on a wafer as part of the semiconductor fabrication process be formed closer together, and that the spacings established between such features be made narrower. The respective heights of some of the features, however, may not be reduced (e.g., due to photolithographic constraints). The generally fixed feature heights coupled with the shrinking spacings between features results in increased shadowing, whereby certain portions of the wafer less than a desired amount of dopants. Such shadowing can become more exaggerated where an ion implantation angle is increased, such as to diminish channeling, for example.

Figure 3:
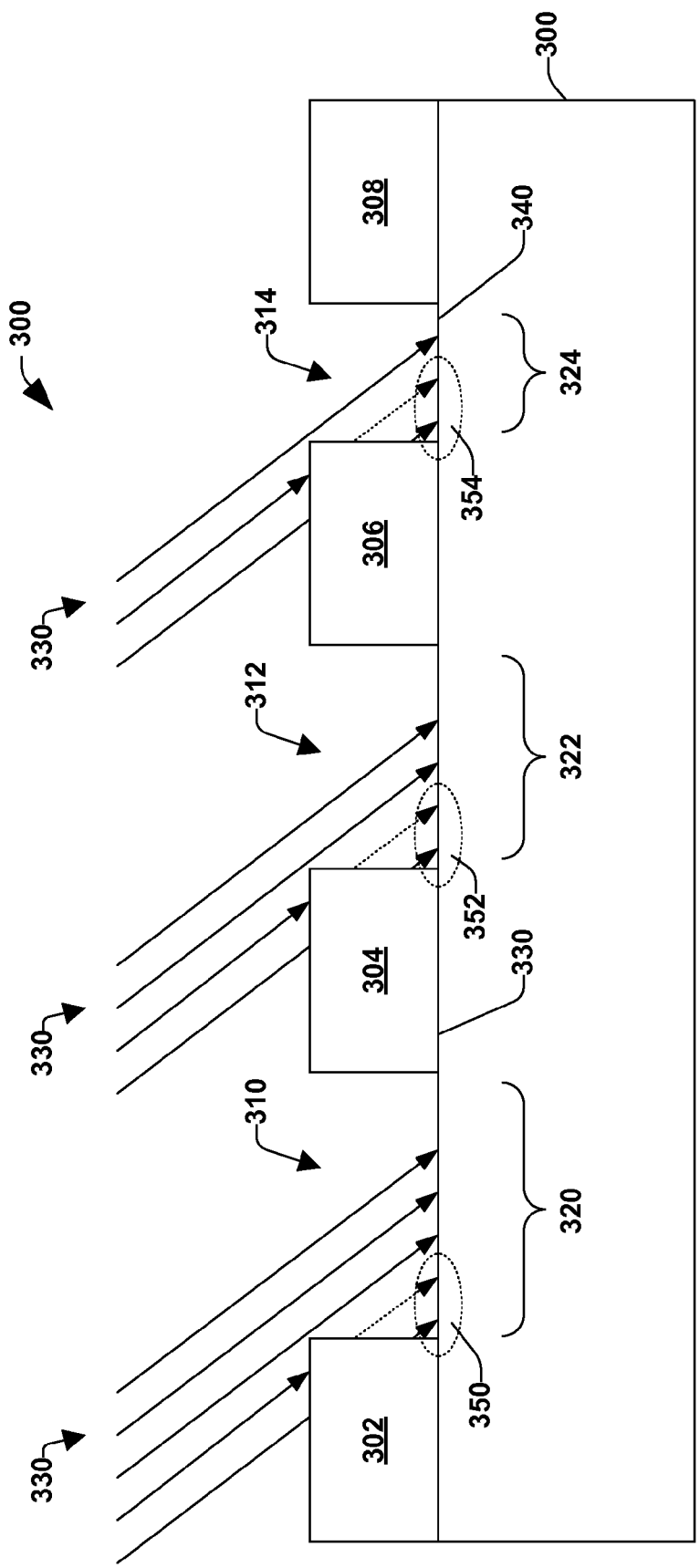
FIG. 3 is a cross-sectional view of a portion of a semiconductor substrate having features formed thereon that are separated by varying distances and that experiences shadowing effects to varying degrees during ion implantation.

Turning to FIG. 3, for example, a cross sectional view of a portion of a semiconductor substrate or wafer 300 has a plurality of features 302, 304, 306, 308 formed thereon, and respective spacings 310, 312, 314 are defined there-between. The features 302, 304, 306, 308 are formed out of a resist material and thus are all of substantially the same height. Some of the resist features 302, 304, 306, 308 are, however, formed closer together than others, and thus the corresponding spacings 310, 312, 314 there-between are of different widths.

Areas 320, 322, 324 of the substrate 300 exposed by the spacings 310, 312, 314 are to be doped via ion implantation. Accordingly, one or more ion beams 330 are directed at the substrate 300 to perform the doping. The beams 330 are, however, oriented at an angle with respect to a surface 340 of the substrate 300 to mitigate channeling, for example. Some of the beams 330 thus have some of their ions blocked by portions (e.g., corners) of the features 302, 304, 306, 308. As such, regions 350, 352, 354 within the substrate areas 320, 322, 324 receive less than intended amounts of dopant ions. It can be seen that as the features 302, 304, 306, 308 are brought closer together and the respective spacings 310, 312, 314 are thereby made more narrow, the insufficiently doped regions 350, 352, 354 make up larger portions of the substrate areas 320, 322, 324.

Figure 4:
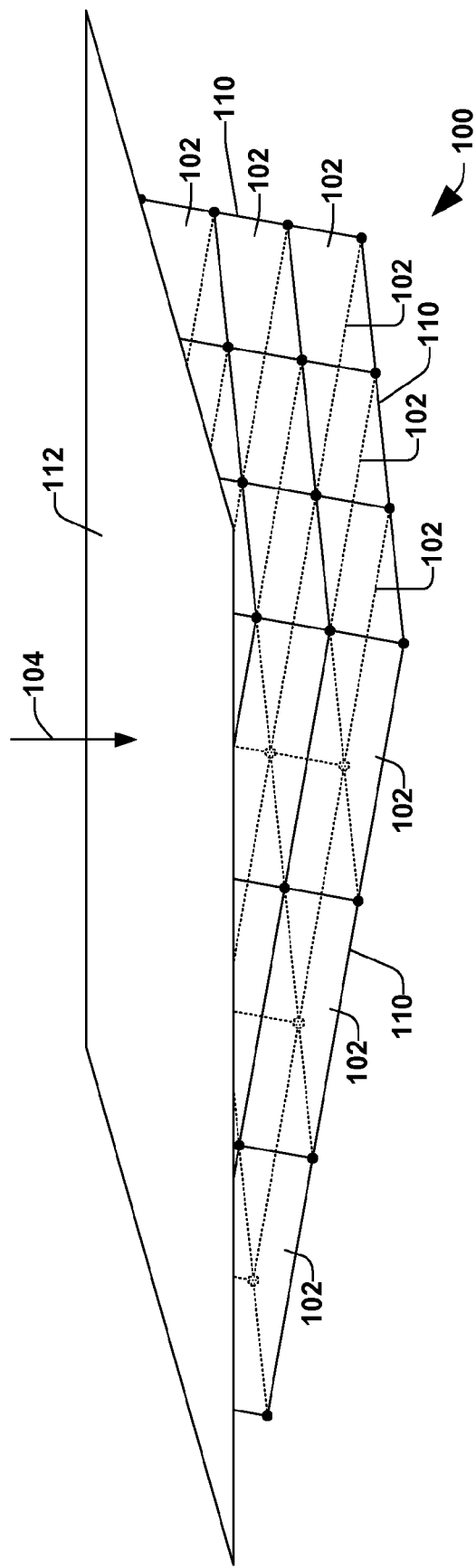

FIG. 4 is similar to FIGS. 1 and 2, but illustrates a common situation where the mechanical surface 112 of the wafer is not coplanar with the crystalline lattice structure of the wafer. It can thus be appreciated that compound movements of the wafer may need to be made during the ion implantation process to maintain the relative orientation between the mechanical surface 112 of the wafer and the ion beam 104 as well as the relative orientation between the crystalline lattice structure of the wafer and the ion beam 104 to maintain a desirable balance between channeling and shadowing, for example.

Figure 5:
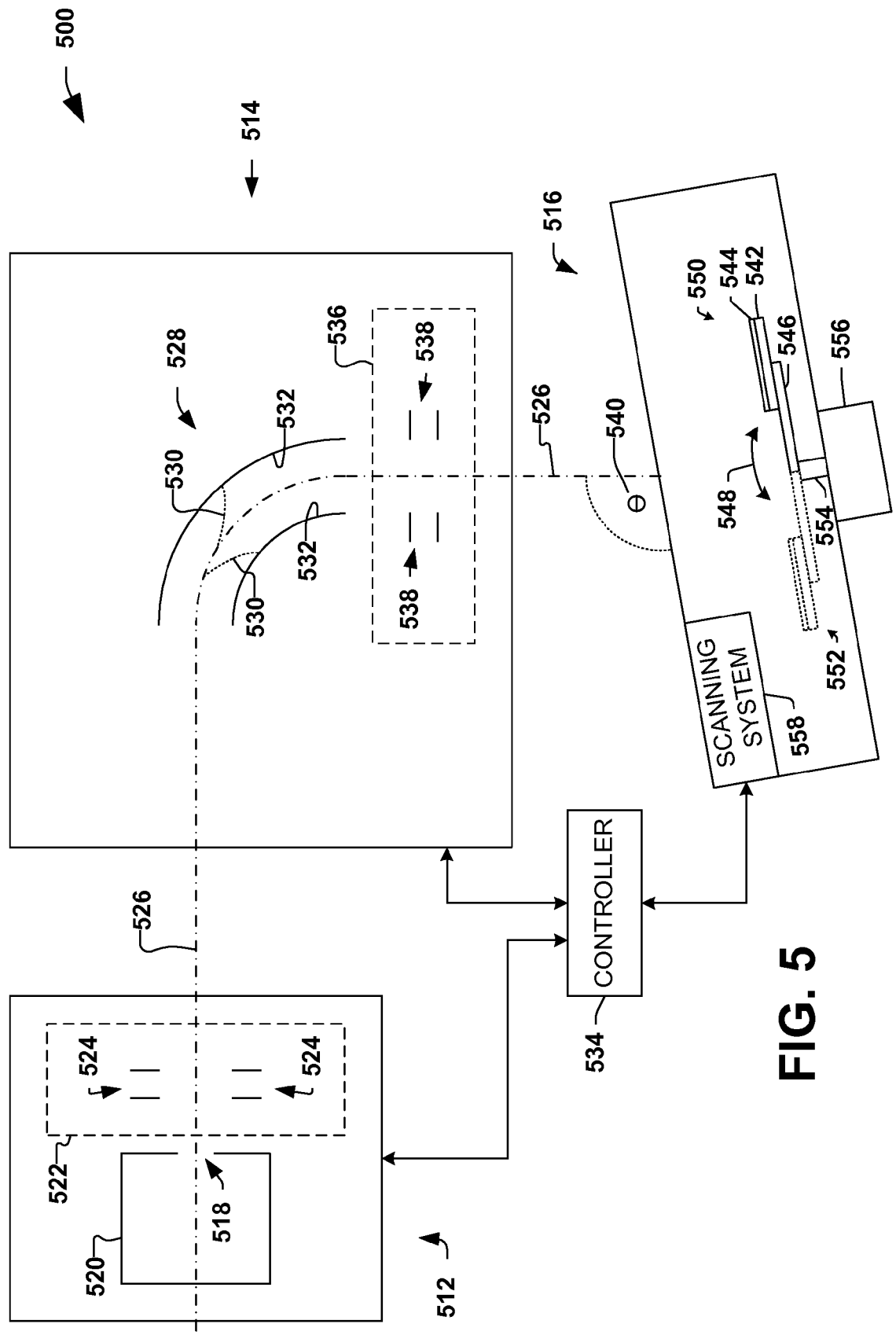
FIG. 5 is a block diagram illustrating an exemplary ion implantation system as described herein.

FIG. 5 is a plan view illustrating an exemplary ion implantation system 500 suitable for implanting ions into a workpiece as described herein. The implantation system 500 includes an ion source 512, a beamline assembly 514, and a target or end station 516. The ion source 512 comprises an ion generation chamber 520 and an ion extraction (and/or suppression) assembly 522. A (plasma) gas of a dopant material (not shown) to be ionized is located within the generation chamber 520. The dopant gas can, for example, be fed into the chamber 520 from a gas source (not shown). Energy can be imparted to the dopant gas via a power source (not shown) to facilitate generating ions within the chamber 520. It will be appreciated that the ion source 512 can also utilize any number of suitable mechanisms (not shown) to excite free electrons within the ion generation chamber 520, such as RF or microwave excitation sources, electron beam injection sources, electromagnetic sources and/or a cathode which creates an arc discharge within the chamber, for example. The excited electrons collide with the dopant gas molecules in the chamber 520 and ions are thereby generated. Generally positive ions are generated, but negative ions may be generated as well. The ions are controllably extracted through a slit 518 in the chamber 520 by the ion extraction assembly 522, which comprises a plurality of extraction and/or suppression electrodes 524. It will be appreciated that the extraction assembly 522 can include, for example, an extraction power supply (not shown) to bias the extraction and/or suppression electrodes 524 to accelerate the ions from the source 512 along a trajectory leading to a mass analyzing magnet 528 within the beamline assembly 514.

Accordingly, the ion extraction assembly 522 functions to extract a beam 526 of ions from the plasma chamber 520 and to accelerate the extracted ions into the beamline assembly 514, and more particularly into a mass analysis magnet 528 within the beamline assembly 514. The mass analysis magnet 528 is formed at about a ninety degree angle and a magnetic field is generated therein. As the beam 526 enters the magnet 528, it is correspondingly bent by the magnetic field such that ions of an inappropriate charge-to-mass ratio are rejected. More particularly, ions having too great or too small of a charge-to-mass ratio are deflected 530 into side walls 532 of the magnet 528. In this manner, the magnet 528 only allows those ions in the beam 526 which have the desired charge-to-mass ratio to completely traverse there-through. Control electronics or a controller 534 can be included to adjust the strength and orientation of the magnetic field, among other things. The magnetic field can, for example, be controlled by regulating the amount of electrical current that runs through field windings of the magnet 528. It will be appreciated that the controller 534 may include a programmable micro-controller, processor and/or other type of computing mechanism for overall control of the system 500 (e.g., by an operator, previously and/or presently acquired data and/or programs).

The beamline assembly 514 may also include an accelerator 536, for example, that comprises a plurality of electrodes 538 arranged and biased to accelerate and/or decelerate ions, as well as to focus, bend and/or decontaminate the ion beam 526. Further, it will be appreciated that ion beam collisions with other particles degrade beam integrity so that the entire beamline assembly 514 from the source 512 to the end station 516, including the mass analysis magnet 528, may be evacuated, for example, by one or more pumps (not shown).

An end station 516 is located downstream of the accelerator 536 and is configured to receive the mass analyzed ion beam 526 from the beamline assembly 514. The end station 516 can be rotated by an angle θ 540 with regard to the beam 526 allowing a user to change the implant angle on the wafer. This may be desirable, for example, to direct the ion beam at a particular orientation relative to the lattice structure to achieve a desired level of channeling and/or localization of doping or to control shadowing. The end station 516 in the illustrated example performs a pendulum type of scan wherein a wafer holder or end effector 542 upon which a wafer or workpiece 544 resides is coupled to an arm 546 that moves the effector 542, and thus the wafer 544, through a first arcuate scan path 548 between first 550 and second 552 extremes. The arm is driven by respective shafts 554 of one or more motors 556 that are part of a scanning system 558 that may be controlled, at least in part, by controller 534. One or more motors (not shown) of the scanning system 558 may also serve to move the end station 516 through angle θ 540 relative to the central axis or vertex of the ion beam 526. It will be appreciated that scan path 548 (e.g., between first 550 and second 552 positions) need only be large enough to move the entire span or width of the portion of wafer 544 being scanned through the beam 526. It will be appreciated that one or more motors (not shown) of the scanning system 558 may also serve to move the wafer 544 up and down (e.g., in a y direction) along a second scan path (e.g., into and out of the page) to facilitate scanning the entire (height) of the wafer 544. Such motors may comprise worm gear, ball screw and/or servo type motors, for example.

Figure 6:
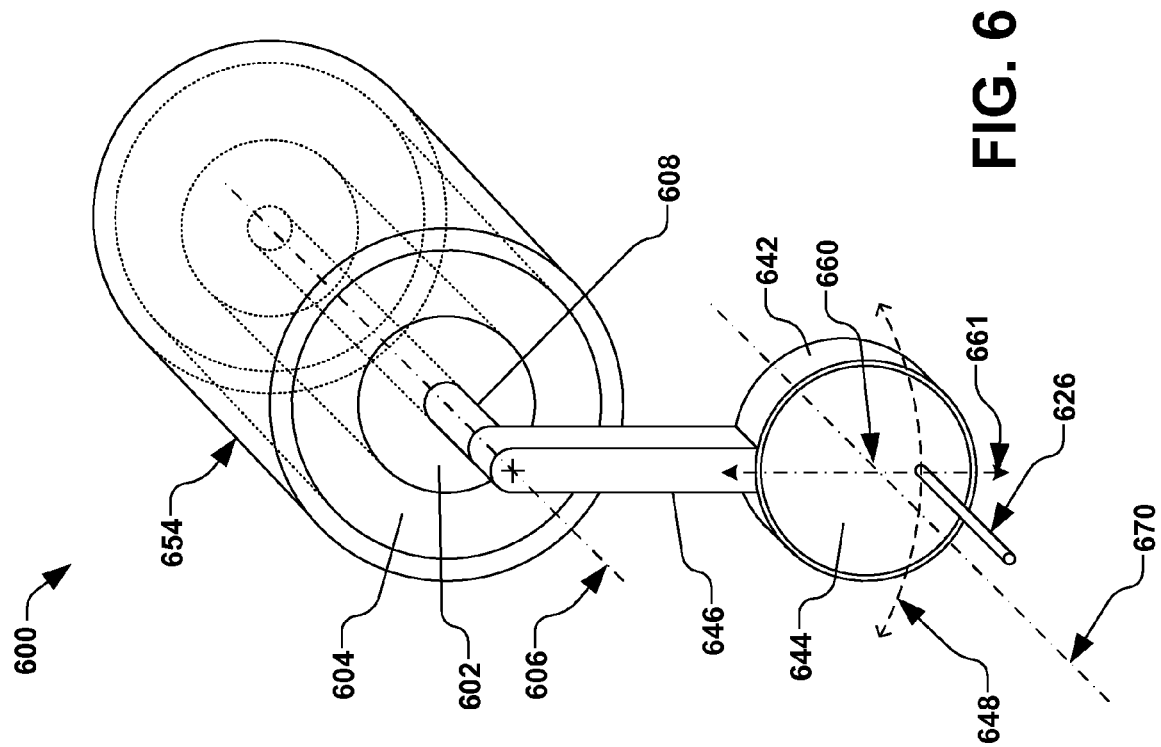
FIG. 6 is a perspective view of an arrangement operable to facilitate a pendulum type of scan as described herein.

FIG. 6 illustrates a simplified perspective view of an arrangement 600 operable to facilitate a pendulum type of scan by oscillating a workpiece 644 along a first arcuate scan path 648 and through an ion beam 626. The arrangement 600 may be comprised within the end station 516 illustrated in FIG. 5, for example, and comprises a motor 654 operably coupled to a scan arm 646. An end effector 642 whereon the workpiece 644 is maintained is coupled to the scan arm 646. The motor 654, for example, comprises a rotor 602 and a stator 604, wherein the rotor and the stator are dynamically coupled and operable to individually rotate about a first axis 606. The rotor 602 is further operably coupled to a shaft 608, wherein the shaft 608 generally extends along the first axis 606 and is operably coupled to the scan arm 646. In the present example, the rotor 602, shaft 608, and scan arm 646 are generally fixedly coupled to one another, wherein rotation of the rotor 602 about the first axis 606 generally drives rotation of the shaft 608 and scan arm 646 about the first axis 606, thus generally translating the workpiece 644 along the first arcuate scan path 648.

As will be appreciated, the workpiece 644 is also rotated about a second axis 670 as it is moved along the first arcuate scan path 648. The second axis 670 runs through the center 660 of the workpiece 644 and is parallel to the first axis 606. This allows the workpiece 644 to maintain an upright position while it is moved along the first arcuate scan path 648. That is, the vertical orientation of the workpiece 644, as indicated by line 661, is preserved throughout the movement of the workpiece 644 along the first arcuate scan path 648.

Figure 7:
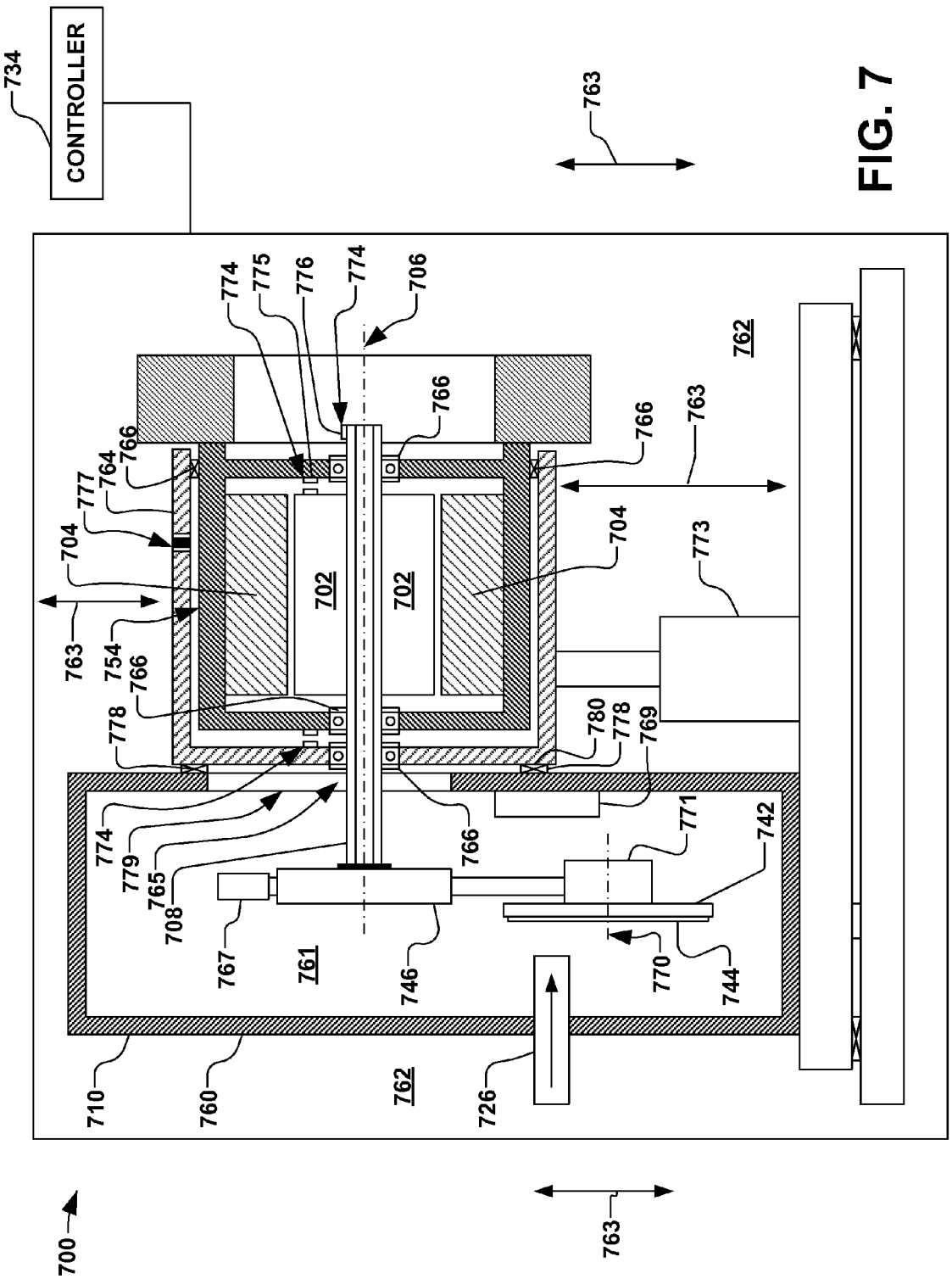
FIG. 7 is a cross sectional view of an arrangement operable to facilitate a pendulum type of scan as described herein.

FIG. 7 is a cross sectional view of an arrangement 700 operable to facilitate a pendulum type of scan by oscillating a workpiece 744 along a first arcuate scan path 648 (FIG. 6) and through an ion beam 726. The arrangement 700 may be comprised within the end station 516 illustrated in FIG. 5, for example, and comprises a motor 754 operably coupled to a process chamber 710, wherein the process chamber is further associated with the ion beam 726. The ion beam 726, for example, may comprise a group of ions traveling together along close, substantially parallel, trajectories taking the form of a spot or so-called "pencil beam". The process chamber 710 may comprise a generally enclosed vacuum chamber 760, wherein an internal environment 761 within the process chamber is operable to be generally isolated from an external environment 762 outside the process chamber. For example, the vacuum chamber 760 can be configured and equipped so as to maintain the internal environment 761 at a substantially low pressure (e.g., a vacuum). The process chamber 710 may be further coupled to one or more load lock chambers (not shown), wherein the workpiece 744 may be transported between the internal environment 761 of the process chamber 710 and the external environment 762 without substantial loss of vacuum within the process chamber 710. The process chamber 710 may alternatively be comprised of a generally non-enclosed process space (not shown), wherein the process space is generally associated with the external environment 762.

The motor 754 comprises a rotor 702 and a stator 704, wherein the rotor 702 and the stator 704 are operable to individually rotate about a first axis 706, and wherein an electromagnetic force (not shown) between the rotor 702 and the stator 704 generally drives a rotation of the rotor 702 about the first axis 706. For example, a control of the electromagnetic force between the rotor 702 and the stator 704 is operable to selectively drive the rotation of the rotor 702 in a clockwise or counter-clockwise direction about the first axis 224, as will be discussed infra. The motor 754 further comprises a motor housing 764, wherein the motor housing 764 is generally stationary with respect to the first axis 706. The motor housing 764 in the present example generally encases the rotor 702 and stator 704, and further generally serves as the generally stationary reference for the rotation of the rotor 702 and stator 704. At least a portion of the rotor 702 and stator 704 generally reside within the motor housing 764. Accordingly, the rotor 702 and the stator 704 are operable to individually rotate with respect to the motor housing 764.

The motor 754, in one example, comprises a brushless DC motor, such as a three-phase brushless DC servo motor. The motor 754, for example, may be sized such that a substantially large diameter of the motor (e.g., a respective diameter of the stator 704, and/or the rotor 702) provides a substantially large torque, while maintaining a moment of inertia operable to provide rapid control of the rotation of the rotor 702. The arrangement 700 further comprises a shaft 708 operably coupled to the motor 754, wherein in one example, the shaft 754 is fixedly coupled to the rotor 702 and generally extends along the first axis 706 into the process chamber 710. In the illustrated example, the rotor 702 is directly coupled to the shaft 708, as opposed to being coupled via one or more gears (not shown), wherein such a direct coupling maintains a substantially low moment of inertia associated with the rotor 702, while further mitigating wear and/or vibration that may be associated with the one or more gears.

In the illustrated example, the process chamber 710 comprises an aperture 765 therethrough, wherein the shaft 708 generally extends through the aperture from the external environment 762 to the internal environment 761, and wherein the motor 754 generally resides in the external environment 762. Accordingly, the shaft 708 is operable to rotate about first axis 706 in conjunction with the rotation of the rotor 702, wherein the shaft 706 is generally rotatably driven by the rotor 702 in alternating, opposite directions. In the present example, the shaft 708 may be substantially hollow, thereby providing a substantially low inertial mass. Likewise, the rotor 702 may be substantially hollow, further providing a substantially low rotational inertial mass.

One or more low-friction bearings 766, for example, are further associated with the motor 754 and the shaft 708, wherein the one or more low-friction bearings 766 rotatably couple one or more of the rotor 702, the stator 704, and the shaft 708 to a generally stationary reference, such as the housing 764 or the process chamber 710. The one or more low-friction bearings 766, for example, generally provide a low coefficient of friction between the respective rotor 702, stator 704, shaft 708, and motor housing 764. In another example, at least one of the one or more low-friction bearings 766 may comprise an air bearing (not shown), a liquid field environment, or other bearing known in the art. To inhibit contaminants from entering the internal environment 761, the shaft 708 is generally sealed between the process chamber 710 and the external environment 762 by a rotary seal (not shown) associated with the shaft 708 and the process chamber 710, whereby the internal environment 761 within the process chamber 710 is generally isolated from the external environment 762.

A scan arm 746 is operably coupled to the shaft 708, and an end effector 742 upon which the wafer 744 is maintained is operably coupled to the scan arm 746. The end effector 742, for example, comprises an electrostatic chuck (ESC) or other workpiece clamping device operable to selectively clamp or maintain the workpiece 744 with respect to the end effector 742. Rotation of the shaft 708 about the first axis 706 generally translates the workpiece 744 with respect to the first axis 706. In one example, the scan arm 746 is coupled to the shaft 708 at a center of gravity of the scan arm, wherein the scan arm 746 is substantially rotationally balanced about the first axis 706. The scan arm 746 may be comprised of a light weight material, such as magnesium or aluminum, for example.

The scan arm 746 may further comprise a counterweight 767 operably coupled thereto, wherein the counterweight generally balances a mass of the scan arm 746, end effector 742, and the workpiece 744 about the first axis 706. Such a counterweight 767 may advantageously assist in centering the mass moment of inertia of the scan arm 746 about the first axis 706, thus dynamically balancing the scan arm 746 about the first axis 706. Accordingly, the scan arm 746, shaft 708, rotor 702, and stator 704 are generally dynamically balanced about the first axis 706, thus generally eliminating side load forces, other than gravitational forces. The counterweight 767, for example, may be comprised of heavier metal than the scan arm 746, such as steel, for example. A load lock chamber (not shown) may be associated with the process chamber 710, wherein scan arm 746 is further operable to rotate and/or translate the end effector 742 to the load lock chamber in order to insert or remove workpieces to or from the process chamber 710. Furthermore, a Faraday cup 769 is provided within the process chamber 710 and positioned within a path of the ion beam 726, wherein the Faraday cup 769 is operable to generally sense a beam current associated with the ion beam 726. Accordingly, the sensed beam current can be utilized for subsequent process control.

The end effector 742 may, for example, be rotatably coupled to the scan arm 746 about a second axis 770, wherein the end effector 742 is operable to rotate (e.g., 890 of FIG. 8) about the second axis 770. An end effector actuator 771 may be operably coupled to the scan arm 746 and the end effector 742, wherein the end effector actuator 771 is operable to rotate the end effector 742 about the second axis 770. The second axis 770, for example, is generally parallel to the first axis 706, wherein the end effector actuator 771 may be operable to selectively rotate the workpiece 744 relative to the ion beam 726 to vary a so-called "twist angle" of implant. Alternatively, the rotatable coupling of the end effector 742 to the scan arm 746 may be utilized to maintain a rotational orientation (e.g., rotational orientation 872 of FIG. 8) of the workpiece 744 with respect to the ion beam 726 by continuously controlling the rotation of the end effector 742 about the second axis 770. The end effector actuator 771 may comprise a motor (not shown) or mechanical linkage (not shown) associated with the scan arm 746 operable to maintain the rotational orientation of the workpiece 744 with respect to the ion beam 726. Alternatively, the end effector actuator 771 may comprise a pivot mount (not shown) associated with the second axis 770, wherein inertial forces associated with the workpiece 744 are operable to maintain the rotational orientation of the workpiece 744 with respect to the ion beam 726. Maintaining the rotational orientation of the workpiece 744 with respect to the ion beam 726 is advantageous when the ion beam impinges on the workpiece at a non-orthogonal angle (not shown), and/or when a crystalline or other structure associated with the workpiece (e.g., a semiconductor substrate, or a substrate having structures formed thereon) plays a role in the uniformity of the ion implantation.

Figure 8:
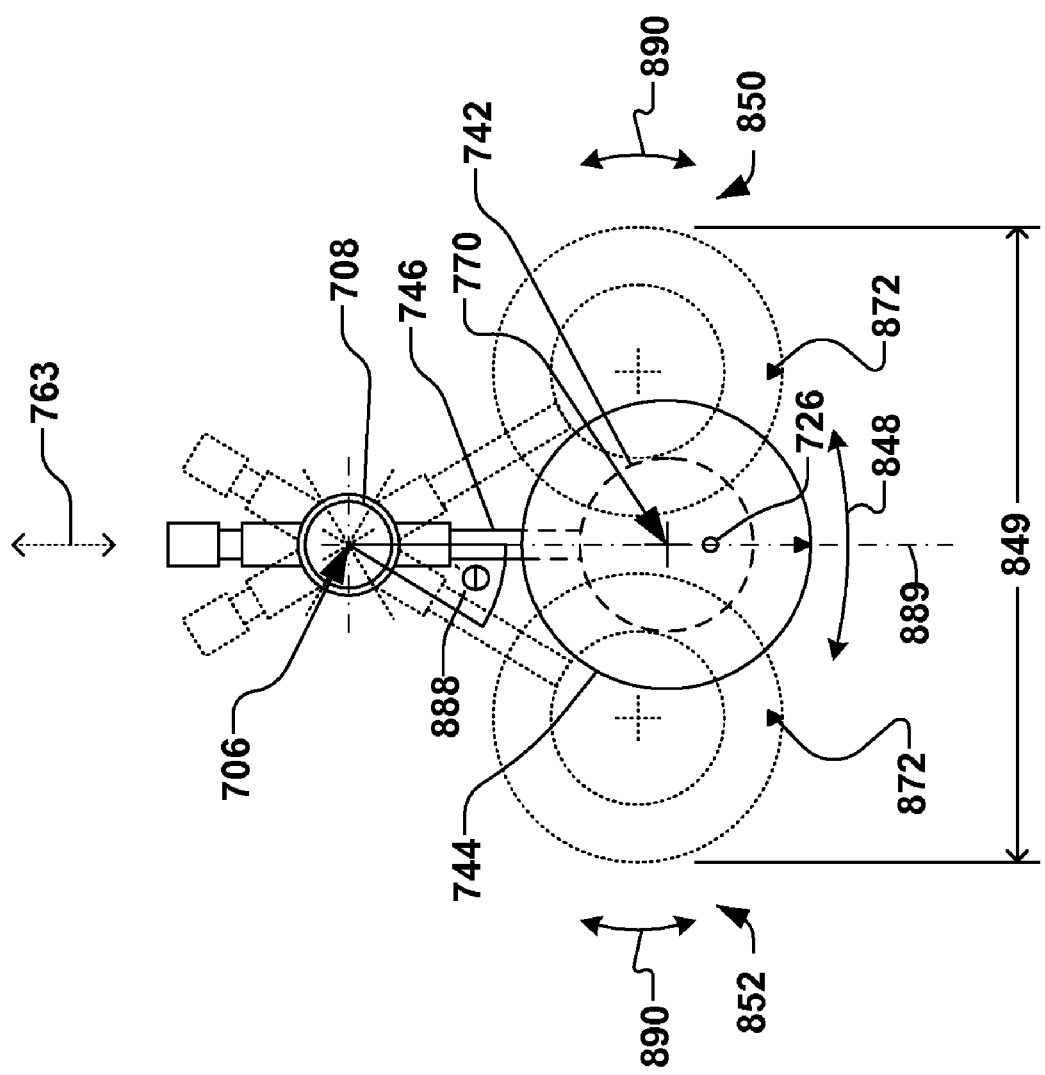
FIG. 8 is a front view of an arrangement operable to facilitate a pendulum type of scan as described herein.

FIG. 8 illustrates a front view of a pendulum type of scan that can be performed as described herein (e.g., with the arrangement illustrated in FIG. 7), wherein the workpiece 744 traverses a first arcuate scan path 848 so as to pass in front of the beam 726, and where the beam 726 is perpendicular to the plane of the page (e.g., going into and out of the page). The shaft 708 rotates about the first axis 706 such that the scan arm 746, end effector 742, and workpiece 744 are rotated through an angle θ' 888 as measured from the vertical-most position 889 of the arm 746 (e.g., where the workpiece is at the "bottom" of its pass along the first arcuate scan path 848). Accordingly, the workpiece 744 can be reciprocally translated along the first arcuate scan path 848 with respect to the ion beam 726 (e.g., via one or more cyclical counter-rotations of the shaft 708 about the first axis 706). The rotation (and counter-rotation) of the shaft 708 about the first axis 706 can be advantageously controlled in order to oscillate or reciprocate the end effector 742 along the first arcuate scan path 848 in a uniform manner.

The end effector 742 can be rotated 890 about the second axis 770 as discussed above, wherein the rotation of the end effector 742, and hence, the workpiece 744, about the second axis 770 can be further controlled in order to maintain the rotational orientation 872 of the workpiece 744 to the ion beam 726 as the workpiece 744 is moved along the first arcuate scan path 848. For example, rotation of the workpiece 744 about the second axis 770 can be controlled so that a location 872 on the workpiece 744 continues to point down to "six o clock" as the workpiece 744 is moved along the first arcuate scan path 848. In this manner, the beam 726 scans the wafer 744 (and features formed thereon) at a constant angle as the wafer 744 moves along the first arcuate scan path 848. This corresponds to maintaining the vertical orientation 661 of the workpiece 644 as discussed above with regard to FIG. 6.

It will be appreciated that the workpiece 744 is scanned along the first arcuate scan path 848 through a range 849 sufficient to scan the entire workpiece 744 in front of the ion beam 726. Additionally, first 850 and second 852 extremes of the range 849 may allow the entire workpiece 744 to be scanned past the beam 726 so that inertial effects associated with the workpiece 744 reversing direction along the first arcuate scan path 848 are accommodated within overshoot regions. Further, the workpiece 644 may be translated up and down (e.g., in a y direction) along a second scan path 763 by means of a slow scan actuator 773 (FIG. 7) that may comprise an electric motor, hydraulic motor and/or hydraulic driven cylinder, for example. As such, movement of the workpiece 744 along the first arcuate scan path 848 can be said to be associated with a "fast scan" while movement of the workpiece 744 along the second scan path 763 can be said to be associated with a "slow scan". The workpiece 744 may, for example, be continuously transported along the second scan path 763 as the workpiece travels along the first arcuate scan path 848 (thus drawing a zig-zag pattern on the workpiece 744 (an example of such a scan pattern being illustrated in FIG. 9). Alternatively, the workpiece 744 may be indexed along the second scan path 763 between passes of the workpiece 744 along the first arcuate scan path 848 (an example of a resulting scan pattern being illustrated in FIG. 10). The slow scan actuator 773 (FIG. 7) may comprise a servo motor, a ball screw, or other system (not shown), wherein the motor housing 764 and associated motor 754, and hence, the workpiece 744, can be smoothly translated in the y direction along the second scan path 763.

With reference to FIG. 7, it will be appreciated that the electromagnetic force between the stator 704 and the rotor 702 of the motor 754 generally determines a rotational position of the respective rotor 702 and the stator about the first axis 706. Accordingly, the rotational position of the rotor 702 about the first axis 706 generally determines the rotational position of the shaft 708, scan arm 746, end effector 742, and workpiece 744 about the first axis 706, wherein the rotational position of the rotor 702 can be efficiently controlled by controlling the electromagnetic force between the rotor 702 and the stator 704.

One or more sensing elements 774 may also be included that facilitate determining the rotational position of the workpiece 744 along the first arcuate scan path 848 (FIG. 8). For example, the one or more sensing elements 774 are operable to sense the rotational position of one or more of the scan arm 746, shaft 708, rotor 702, and stator 704 about the first axis 706, wherein the sensed rotational position(s) can be utilized for feedback control of the translational position of the workpiece 744. By way of example, the one or more sensing elements 774 may comprise one or more high resolution encoders operable to continuously or repeatedly provide feedback control of the respective rotational position(s) about the first axis 706. In another example, the one or more sensing elements 774 comprise a first encoder 775 operable to sense a rotational orientation of the rotor 702 with respect to the stator 704, and a second encoder 776 operable to sense a rotational orientation of the rotor 702 with respect to the process chamber 710, motor housing 764, ion beam 726, or other stationary reference with respect to the rotor 702, for example.

One or more stops 777 may be included to inhibit a "runaway" incident by limiting rotation of the stator 704 relative to the motor housing 764. The one or more stops 276 may comprise, for example, one or more adjustable mechanical and/or electrical limits operably coupled to the motor housing 764. A dynamic sliding seal 778 (e.g., a sliding bearing seal) may also be included, wherein the sliding seal 778 substantially seals the internal environment 761 of the process chamber 710 from the external environment 762 (e.g., atmosphere). For example, the process chamber 710 may define a slot-shaped aperture 779 therethrough, wherein the shaft 708 generally extends through the slot 779. One or more linear bearings 780, for example, may be utilized to slidingly couple the motor housing 764 to the process chamber 710. Accordingly, the shaft 708 is operable to translate within the slot 779 in conjunction with the translation of the motor 754 in the second direction 763. The sliding seal 778 further surrounds the slot-shaped aperture 779 and further generally isolates the internal environment 761 within the process chamber 710 from the external environment 762. Such a sliding seal 778, for example, further generally isolates the scan arm 746 and end effector 742, and permits the translation of the end effector 742 within the process chamber 710 along the second scan path 763, while limiting potential deleterious effects caused by moving components associated with the motor 754.

Figure 9:
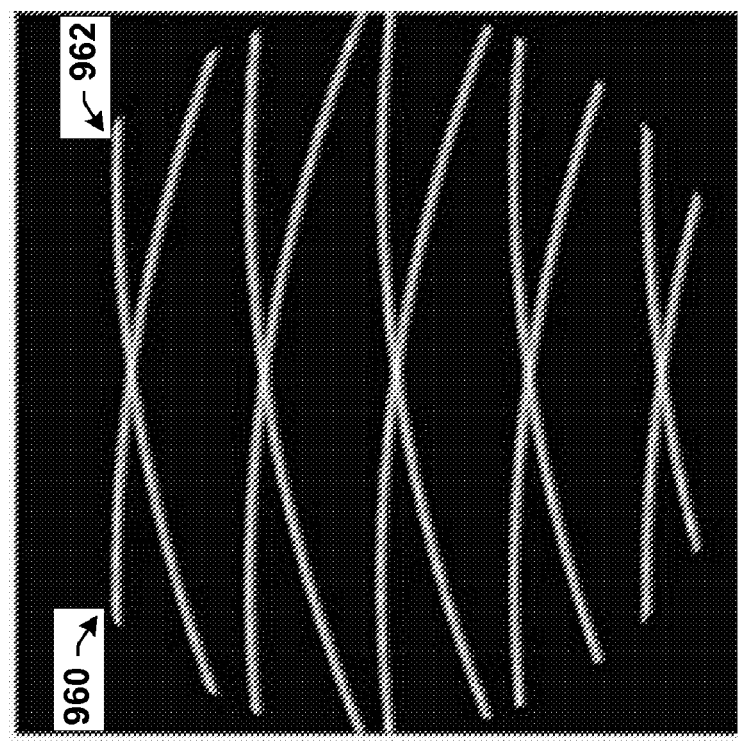
FIG. 9 is an illustration of a scan pattern that can be formed with a pendulum type of ion implantation system showing a possible path for the center of the beam across the wafer.

As in FIG. 5, a controller 734 is depicted in FIG. 7 for controlling movement of the workpiece 744. With reference to FIG. 5, it will be appreciated that the scanning system 558 (e.g., as controlled by controller 534) may move the wafer 544 such that the wafer 544 is oscillated along the first arcuate scan path 548 (648 FIG. 6, 848 FIG. 8) while concurrently being moved along the second scan path 763 (FIGS. 7 & 8) to implant the wafer 544 with ions. A couple of exemplary scan patterns that may result from such an implantation technique are illustrated in FIG. 9, where a first scan pattern 960 is "drawn" on the wafer 544 and then a second scan pattern 962 is "drawn" on the wafer 544 to mirror the first scan pattern 960. The lines represent the position that the center of the beam traverses over the wafer as the slow scan moves at constant linear velocity and the fast scan moves at constant angular velocity with a sharp reversal each time the beam is completely off the wafer. The wafer is rotated about the 770 axis as described herein. In particular, the first scan pattern 960 is formed on the wafer 544 and then the movement of the wafer 544 along the second scan path 763 (FIGS. 7 & 8) is reversed (at a precise moment) so that the second scan pattern 962 is formed on the wafer 544 that mirrors the first scan pattern 960. Alternatively, the wafer 544 can be moved in a step and scan manner where the wafer 544 is indexed along the second scan path 763 between respective passes of the wafer 544 through the beam along the first scan path 558. A resulting scan pattern 1064 is illustrated in FIG. 10.

Figure 10:
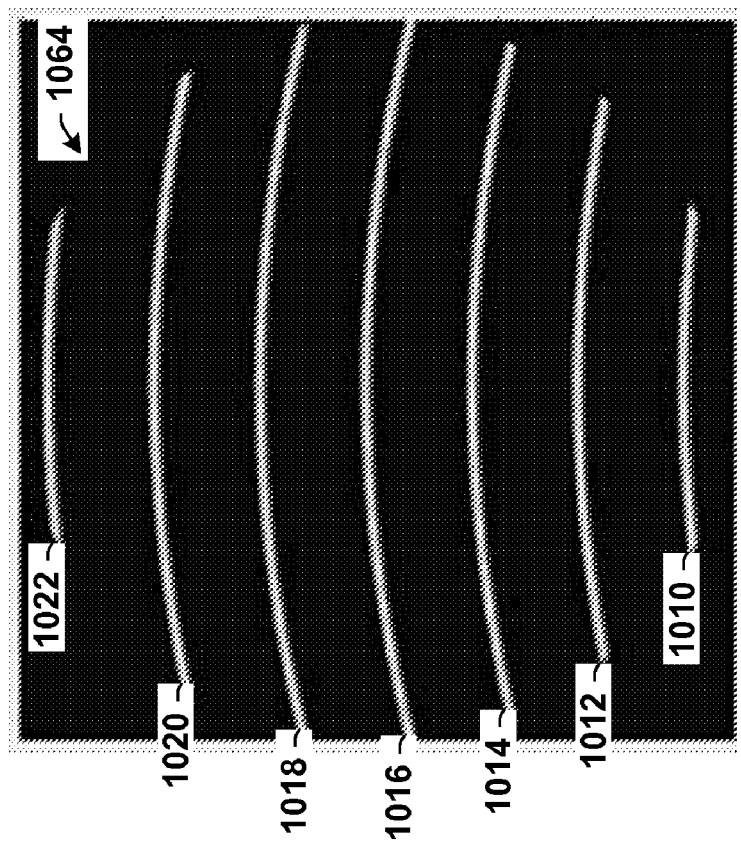
FIG. 10 is an illustration of another scan pattern that can be formed with a pendulum type of ion implantation system.
Figure 11:
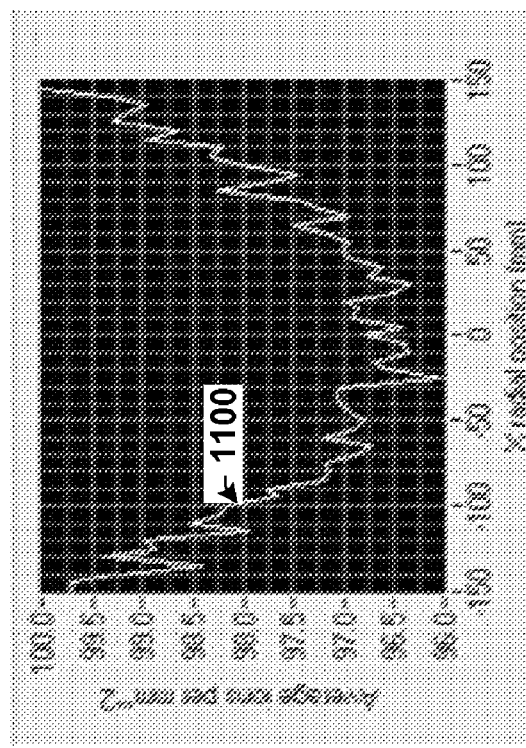
FIG. 11 is an illustration of a curve of dopant density along a horizontal line drawn passing through the wafer center that is indicative of non uniform ion implantation.

Nevertheless, ions may be implanted non-uniformly into the wafer 544 during respective passes of the wafer through the beam 526 in the simplest case where the linear and angular velocities are constant as in FIG. 9, or as the angular velocity is kept constant as in FIG. 10. Under these simplified control conditions FIG. 11 is an illustration of a plot 1100 of the concentration (y axis) of ions deposited as measured on a horizontal scan across the middle of a wafer 544. This may correspond to a line (not shown in FIG. 9 or 10) that is horizontal and positioned vertically half way through the wafer, or rather halfway between the top and bottom of the wafer. In this example, the ion dose drops by about 4% toward the middle of the wafer (e.g., near the 0 radial position or vertical centerline of the wafer 889 (FIG. 8)). Such non uniformity may be a result of, among other things, compound movement of the wafer as it as passes through the ion beam 526 to maintain a relative orientation between the lattice structure and/or mechanical surface of the wafer 544 and the ion beam 526. For example, the wafer 544 may be rotated 890 about the second axis 770 (FIGS. 7 & 8) so that point 872 remains at the same relative position on the wafer 544 (e.g., pointing down to "six o'clock" (FIG. 8)) as the wafer 544 is scanned, (e.g., to mitigate shading and/or to control channeling).

Figure 12:
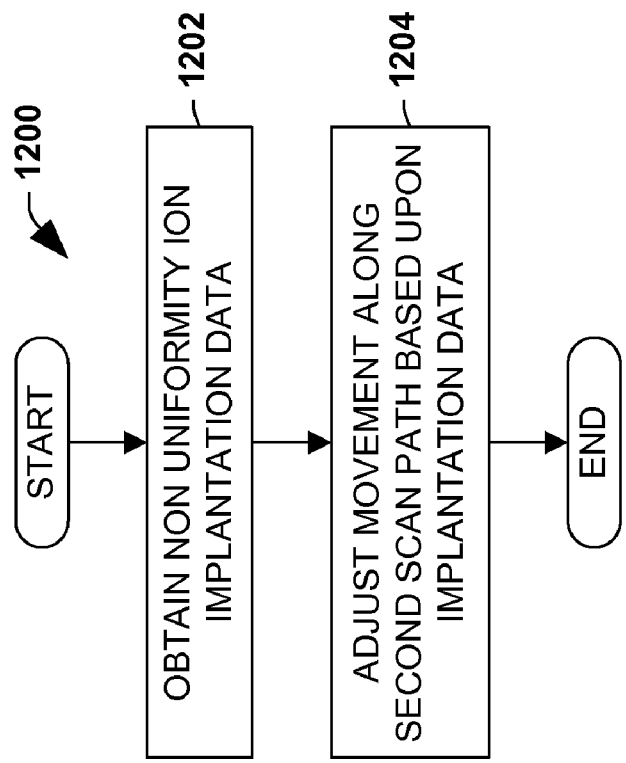
FIG. 12 is a flow diagram illustrating a method for mitigating non uniform ion implantation as described herein.

Accordingly, to mitigate such non uniform ion implantations, the movement of the wafer 544 along the second scan path 763 (FIG. 7) is dynamically adjusted. Thus, turning to FIG. 12 an exemplary methodology 1200 is illustrated for mitigating non uniform ion implantations in a semiconductor workpiece in a pendulum type of implantation arrangement. Although the methodology 1200 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated acts may be required to implement a methodology in accordance with the present invention.

The methodology 1200 begins at 1202 where data regarding the non uniformity of ion implantations across the wafer is obtained. Such data corresponds to one or more respective passes of the wafer 544 through the ion beam 526. By way of example only and not limitation, 7 sets of such data may be obtained for the scan pattern 1064 depicted in FIG. 10, where each set of data may corresponds to a pass across the wafer 544 (e.g., 1010, 1012, 1014, 1016, 1018, 1020, 1022). As such, the curve 1100 in FIG. 11 may be drawn from data corresponding to any pass in FIG. 10 or from data corresponding to any pass in FIG. 9, for example.

It will be appreciated that the data obtained at 1202 may be measured and/or modeled or otherwise developed. The data may be measured, for example, using a Faraday cup or other ion sensitive measuring component incorporated into the end station 516. For example, a Faraday cup 769 (FIG. 7) can be attached to the end effector 542 on the arm 546 and moved through beam 526 in the same manner that the workpiece 544 would be moved through beam 526. Ion dosages, and resulting variations therein, can then be monitored and/or mapped by a monitoring component, such as controller 534, for example. Alternatively, or in addition, the non uniformity implantation data can be developed by modeling the non uniformity of ion implantations, which can be modeled based upon known and/or anticipated orientations of the wafer 544 to the beam 526 (e.g., tilt and/or twist of wafer), angular velocity of the wafer 544, photoresist out gassing, changes in beam current, changes in pressure, etc.

Once the data is obtained, the method 1200 advances to 1204 where the movement (e.g., in the y direction) along the second scan path 763 (FIGS. 7 & 8) is adjusted based upon the non uniformity implantation data. It will be appreciated that the wafer 544 may be put back in place at this point, or the measurement component may remain at 1204 to verify the uniformity of ion implantations. By way of example, the plot 1100 illustrated in FIG. 11 generally corresponds to the cosine of θ' 888 (FIG. 8). An original or intended position along the second scan path 763 can thus be divided by cos(θ') to adjust the movement of the wafer 544 along the second scan path 763. More particularly, a (motor) command such as may be issued by the controller 534, 734 may be adjusted according to:

$$Y \text{ new command} = Y \text{ original command}/\cos(\theta')$$

(Where Y is defined to be the position along the 763 axis)

It will be appreciated that the controller 534, 734 and/or scanning system 558 can make these calculations to facilitate adjusting the movement along the second scan path 763. Additionally, the controller 534, 734 and/or scanning system 558 may, but need not, generate one or more curves such as curve 1100 illustrated in FIG. 11 to ascertain a non uniformity function by which the original or intended movement command along the second scan path 558 is divided to adjust the movement along the second scan path 763. A "curve fitting" technique may be implemented, for example, the by controller 534, 734 and/or scanning system 558 to determine the non uniformity function, for example. It will also be appreciated that the function used to adjust the movement along the second scan path 763 may also take into consideration other factors, such as may be obtained from the respective sets of data generated from the other passes across the wafer 544 (e.g., 1010, 1012, 1014, 1016, 1018, 1020, 1022).

Figure 13:
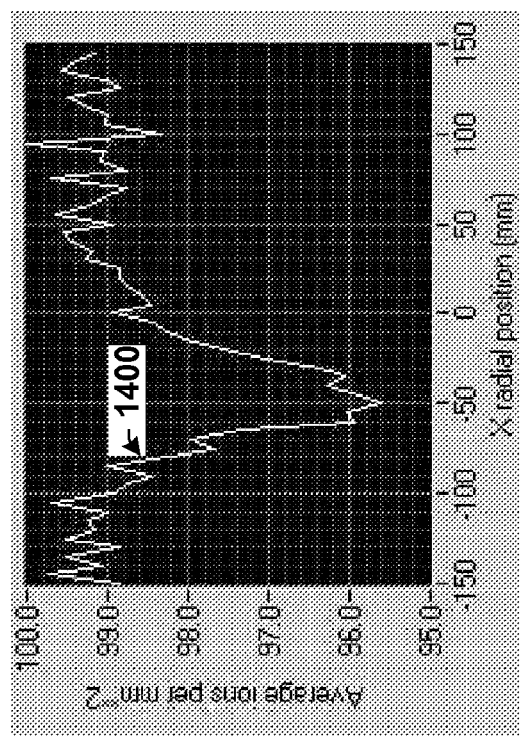
FIG. 13 is an illustration of a mathematical transform of a scan pattern to mitigate non uniform ion implantation as described herein.

FIG. 13 illustrates a mathematical transformation 1300 of the scan pattern 1010-1022 of FIG. 10 adjusted according to the non uniformity function derived from the original angular and vertical scan positions used to draw the path of the beam in FIG. 10. The angle θ' 888 (FIG. 8) through which the workpiece 544 is scanned as it moves along the first arcuate scan path 548 can be thought of as being plotted on the x axis, while the newly adjusted y position of the workpiece 544 as the workpiece 544 is moved along the second scan path 763 can be thought of as being plotted on the y axis. FIG. 13 shows that the scans are farther apart toward the edge of the wafer to reduce the dose at the edge, and thus to compensate for the curve 1100 of FIG. 11 (where the dopant concentration is higher at the edge and lower at the center of the wafer. It will be appreciated that the scan lines are about 4% farther apart toward the edge of the wafer in FIG. 13 than they are at the center of the wafer. This compensates for the about 4% decrease in concentration that occurs toward the middle of the wafer (as indicated by curve 1100 in FIG. 11). Essentially, the wafer 544 receives about 4% less dopants toward the edges of the wafer so that the dopant concentration is more uniform across the wafer 544. FIG. 13 further illustrates that the scan pattern may no longer be formed in a step and scan manner when adjusted by a non uniformity function as described herein. For example, the wafer 544 has to be moved in the second scan path 763 while also being moved in the first arcuate scan path 548, 648, 848 to facilitate the stretched the scan lines near the edge of the wafer 544.

Figure 14:
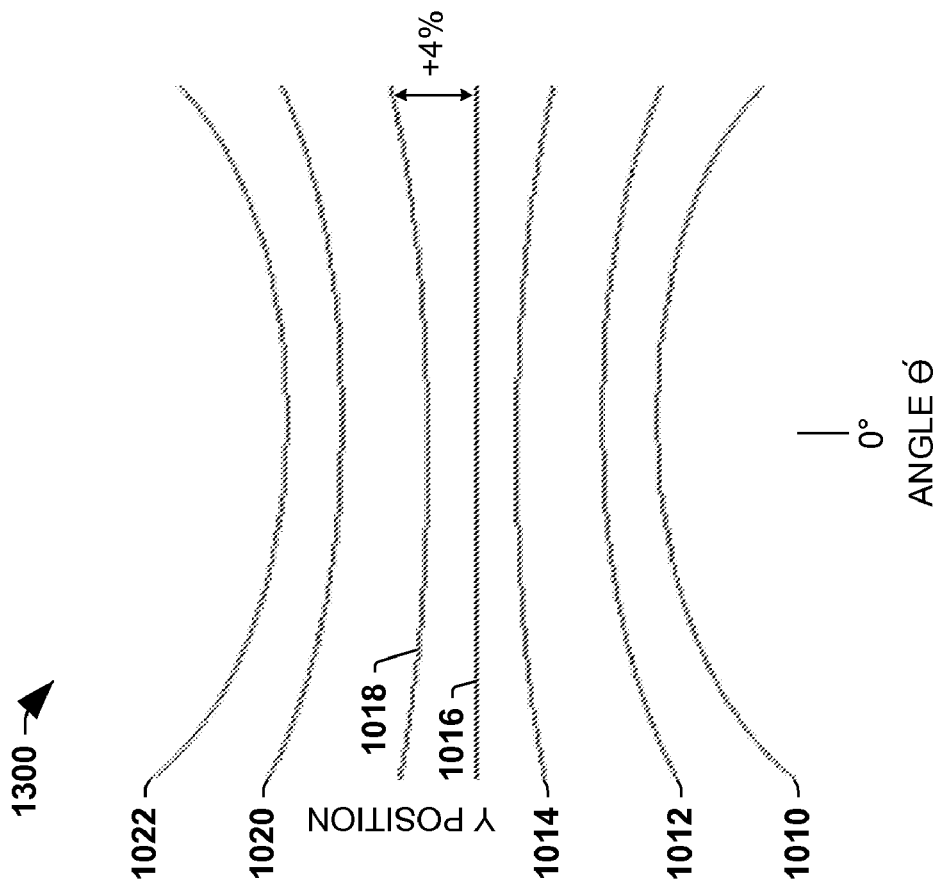
FIG. 14 is an illustration of another curve that is indicative of non uniform ion implantation.

By way of further example, FIG. 14 illustrates another exemplary non uniformity curve 1400 that can be utilized to adjust wafer movement in the y direction or along the second scan path 763. It will thus be appreciated that movement along the second scan path 763 can be adjusted to compensate for many non uniformity functions. This movement can, for example, also be adjusted according to non uniformity functions that result from known repeatable errors in the movement along the first arcuate scan path 548. Accordingly, such known errors can be accounted for or compensated for. Similarly, the movement can be adjusted according to non uniformity functions resulting from out gassing, which occurs when the ion beam impinges upon a patterned resist on the wafer. These functions may be somewhat predictable since the pattern of the resist is known across the wafer, and thus the effects of the out gassing on the implantation process can be predicted.

It will also be appreciated that the movement in the y direction or along the second scan path 558 can be adjusted on the fly during the implantation process to compensate for changes in process conditions, such as changes in beam current, pressure variations, etc. Such changes may, for example, be detected during the implantation process (e.g., by one or more faraday cups and/or pressure sensors) and their effect on the uniformity of ion implantations known and/or modeled. Accordingly, movement along the second scan path 558 can be adjusted according to one or more corresponding non uniformity functions.

As such, non uniform ion implantations can be mitigated as described herein, where non uniform ion implantations are undesirable as they can adversely affect the performance and/or reliability of resulting semiconductor devices fabricated out of and/or upon the workpiece since the dopant atoms implanted into the workpiece alter the electrical properties, characteristics and/or behavior of the workpiece at the implanted areas.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein merely means an example, rather than the best.

What is claimed is:

1. A method of mitigating non uniform ion implantation in a semiconductor workpiece in a pendulum type of ion implantation, comprising:
    oscillating the workpiece in front of an ion beam along a first arcuate scan path; and
    moving the workpiece along a second scan path according to a predetermined second scan path rate; and
    dynamically adjusting the predetermined second scan path rate according to non uniform ion implantation data.

2. The method of claim 1, where dynamic adjustment to the movement of the workpiece along the second scan path is a function of the non uniform ion implantation.

3. The method of claim 2, further comprising:
    dividing an original command for moving the workpiece along the second scan path by a function corresponding to the non uniform ion implantation to adjust the movement of the workpiece along the second scan path.

4. The method of claim 3, where comprising determining the function corresponding to the non uniform ion implantation comprising:
    implementing a curve fitting technique.

5. The method of claim 4, where determining the function corresponding to the non uniform ion implantation comprises:
generating a plot of ion dose across the workpiece.

6. The method of claim 2, comprising determining the non uniform ion implantation comprising:
substituting a measuring component for the workpiece.

7. The method of claim 6, where determining the non uniform ion implantation comprises:
modeling ion implantation.

8. The method of claim 7, where ion implantation is modeled based upon at least one of
orientation of the workpiece to the beam,
angular velocity of the workpiece,
photoresist out gassing,
changes in beam current,
changes in pressure, and
errors in the movement along the first arcuate scan path.

9. A method of mitigating non uniform ion implantation in a semiconductor workpiece in a pendulum type of ion implantation, comprising:
obtaining ion implantation data;
utilizing the ion implantation data to determine a function corresponding to non uniform ion implantation data; and
controlling movement of the workpiece through an ion beam comprising:
moving the workpiece along a first arcuate scan path and moving the workpiece along a second non arcuate scan path according to a predetermined second scan path rate; and
dynamically adjusting the predetermined second scan path rate according to the function corresponding to non uniform ion implantation data, where the movement along the second scan path is adjusted by dividing an original command for moving the workpiece along the second scan path by the function corresponding to non uniform ion implantation.

10. The method of claim 9, where determining the function corresponding to non uniform ion implantation comprises:
implementing a curve fitting technique.

11. The method of claim 9, where determining the function corresponding to non uniform ion implantation comprises:
generating a plot of ion dose across the workpiece.

12. The method of claim 11, were determining the function corresponding to non uniform ion implantation further comprises:
implementing a curve fitting technique.

13. The method of claim 9, where obtaining ion implantation data comprises:
substituting a measuring component for the workpiece.

14. The method of claim 9, where the ion implantation data is obtained via modeling.

15. The method of claim 14, where the modeling considers at least one of
orientation of the workpiece to the beam,
angular velocity of the workpiece,
photoresist out gassing,
changes in beam current,
changes in pressure, and
errors in the movement along the first arcuate scan path.

16. The method of claim 9, where the function is based on an angle $\theta'$ through which the workpiece is scanned as it moves along the first arcuate scan path.

17. The method of claim 16, where the function corresponds to $\cos(\theta')$.

* * * * *